United States Patent [19]

Sumic

[11] Patent Number: 5,568,399
[45] Date of Patent: Oct. 22, 1996

[54] METHOD AND APPARATUS FOR POWER OUTAGE DETERMINATION USING DISTRIBUTION SYSTEM INFORMATION

[75] Inventor: Zarko Sumic, Kirkland, Wash.

[73] Assignee: Puget Consultants Inc., Bellevue, Wash.

[21] Appl. No.: 381,182

[22] Filed: Jan. 31, 1995

[51] Int. Cl.$^6$ .................................................... G06F 17/00
[52] U.S. Cl. .......................................................... 364/492
[58] Field of Search .................................... 364/492, 493, 364/495, 274.2; 395/10, 50, 51, 52, 54, 60, 61, 900, 915, 916, 917, 183.02

[56] References Cited

PUBLICATIONS

Siddiqi, Uzma et al., "An Expert System Dispatcher's Aid for Distribution Feeder Fault Diagnosis", Department of Electrical and Computer Engineering, North Carolina State University, 1988, pp. 519–523.

Hsu, Yuan–Yih et al., "A Heuristic Based fuzzy Reasoning Approach for Distribution System Service Restoration", *IEEE Transactions on Power Delivery*, vol. 9, No. 2, Apr. 1994, pp. 948–953.

Järventausta, P. et al., "Using Fuzzy Sets to Model the Uncertainty in the Fault Location Process of Distribution Networks", *IEEE Transactions on Power Delivery*, vol. 9, No. 2, Apr. 1994, pp. 954–960.

*Primary Examiner*—Ellis B. Ramirez
*Assistant Examiner*—Tony M. Cole
*Attorney, Agent, or Firm*—Christensen, O'Connor, Johnson & Kindness PLLC

[57] ABSTRACT

A method and apparatus are provided for determining the probable location of a fault causing a power outage in a power distribution system (20) having a power distribution grid (22) and a control station (24), the power distribution grid comprising a power source (26) connected to a plurality of terminal nodes (28) by grid branches (30), and corresponding protective devices (32), whose operation minimizes the deleterious effects of power outages. More specifically, method and apparatus are provided for determining distribution system information based on the power distribution grid (22). For each report that is thereafter received of a new power outage, a set of protective devices (32) that possibly operated in response to the fault is identified by upstream tracing from the terminal node (28) to the power source (26). Using "fuzzy set" theory, the possibility that each protective device operated is calculated. The cumulative possibility that each protective device operated is then calculated by summing the possibilities associated with unflagged reports for each protective device. This cumulative possibility is compared to a predetermined confidence threshold associated with each protective device. If the cumulative possibility that a given protective device operated is greater than the confidence threshold, a conclusion is reached that the protective device operated, and all reports that led to that conclusion are flagged so as not to contribute to future outage determinations. If the conclusion is subsequently rejected, the reports that led to the rejected conclusion are unflagged so as to contribute to future outage determinations.

20 Claims, 10 Drawing Sheets

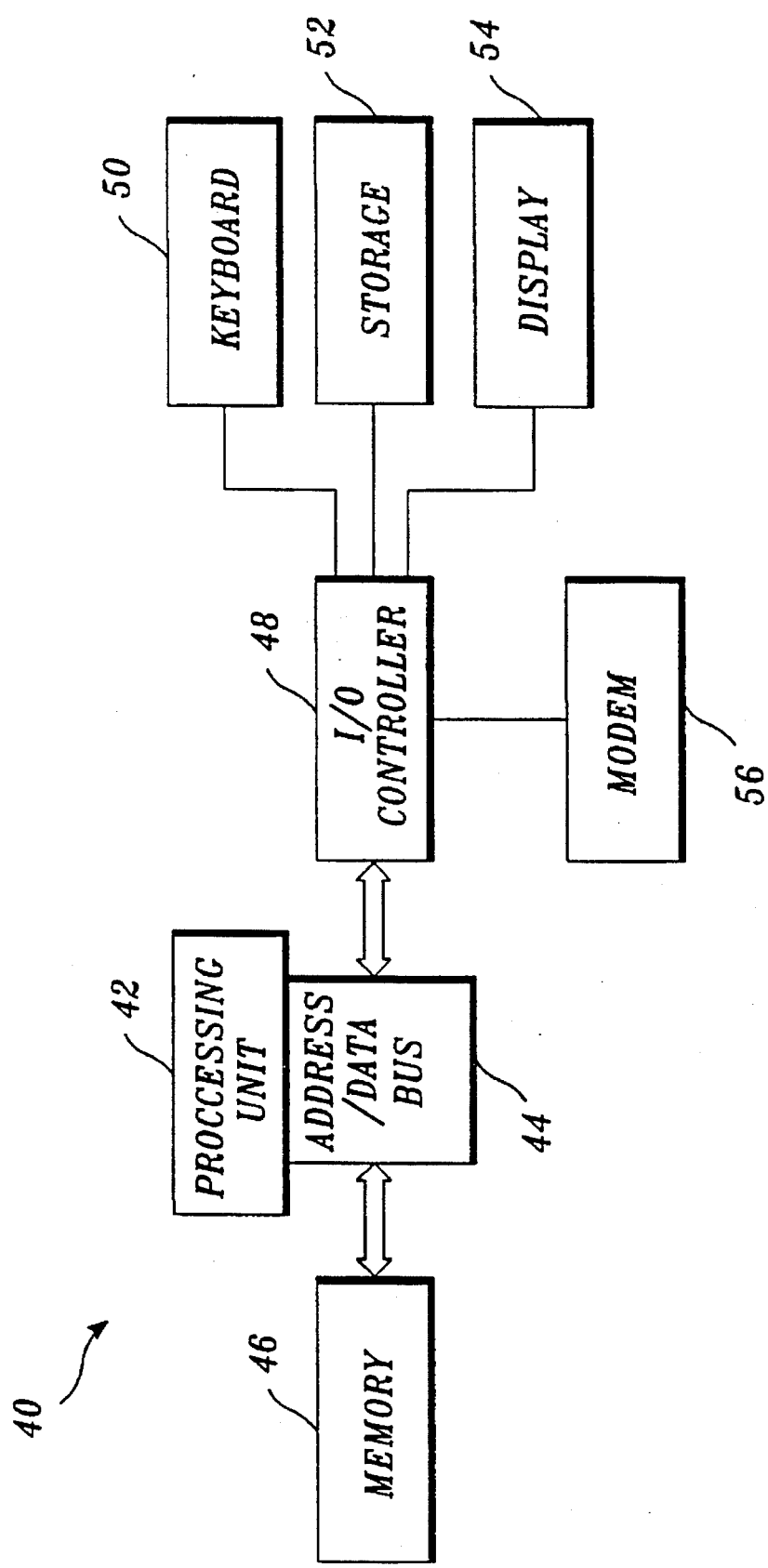

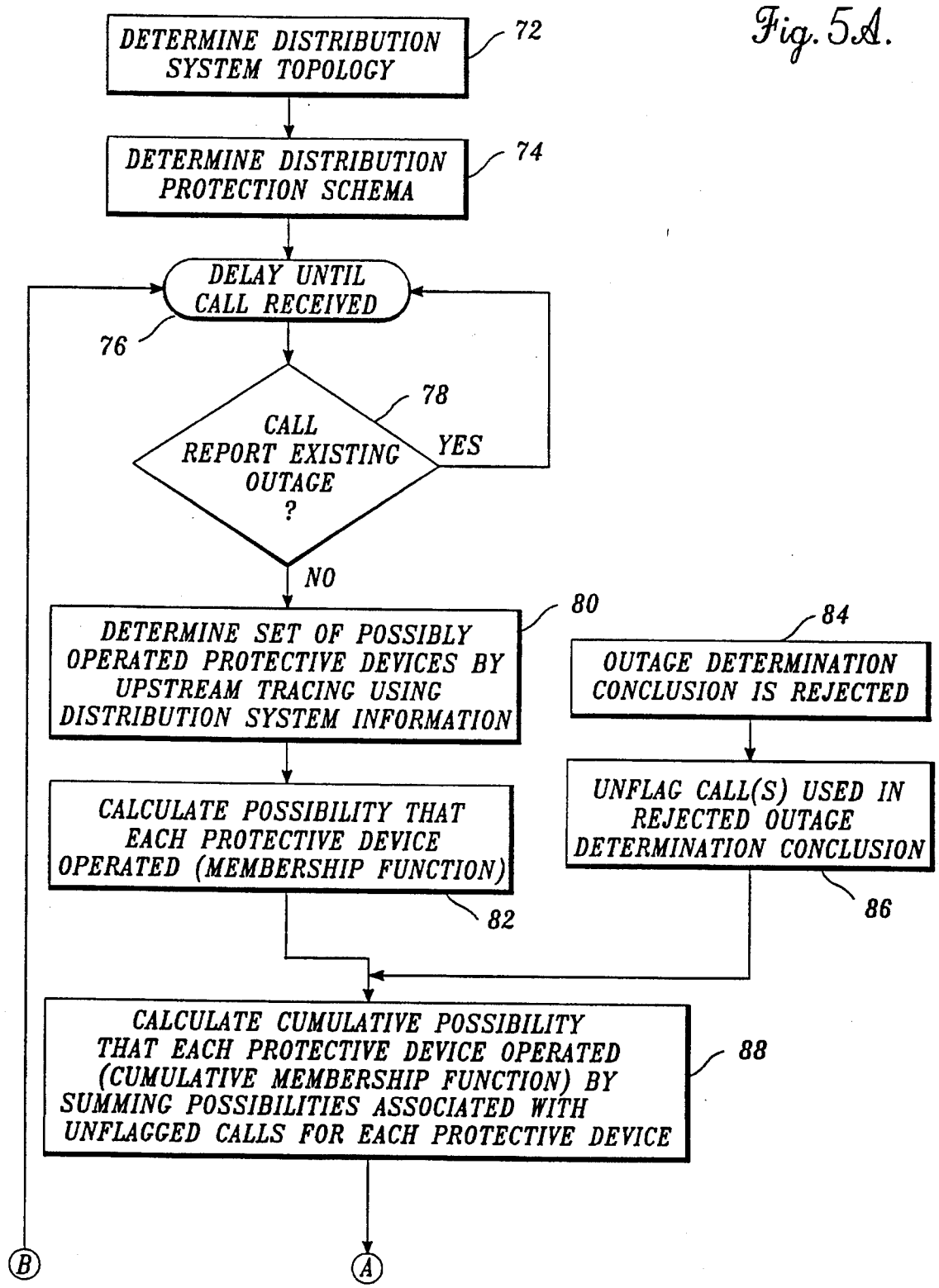

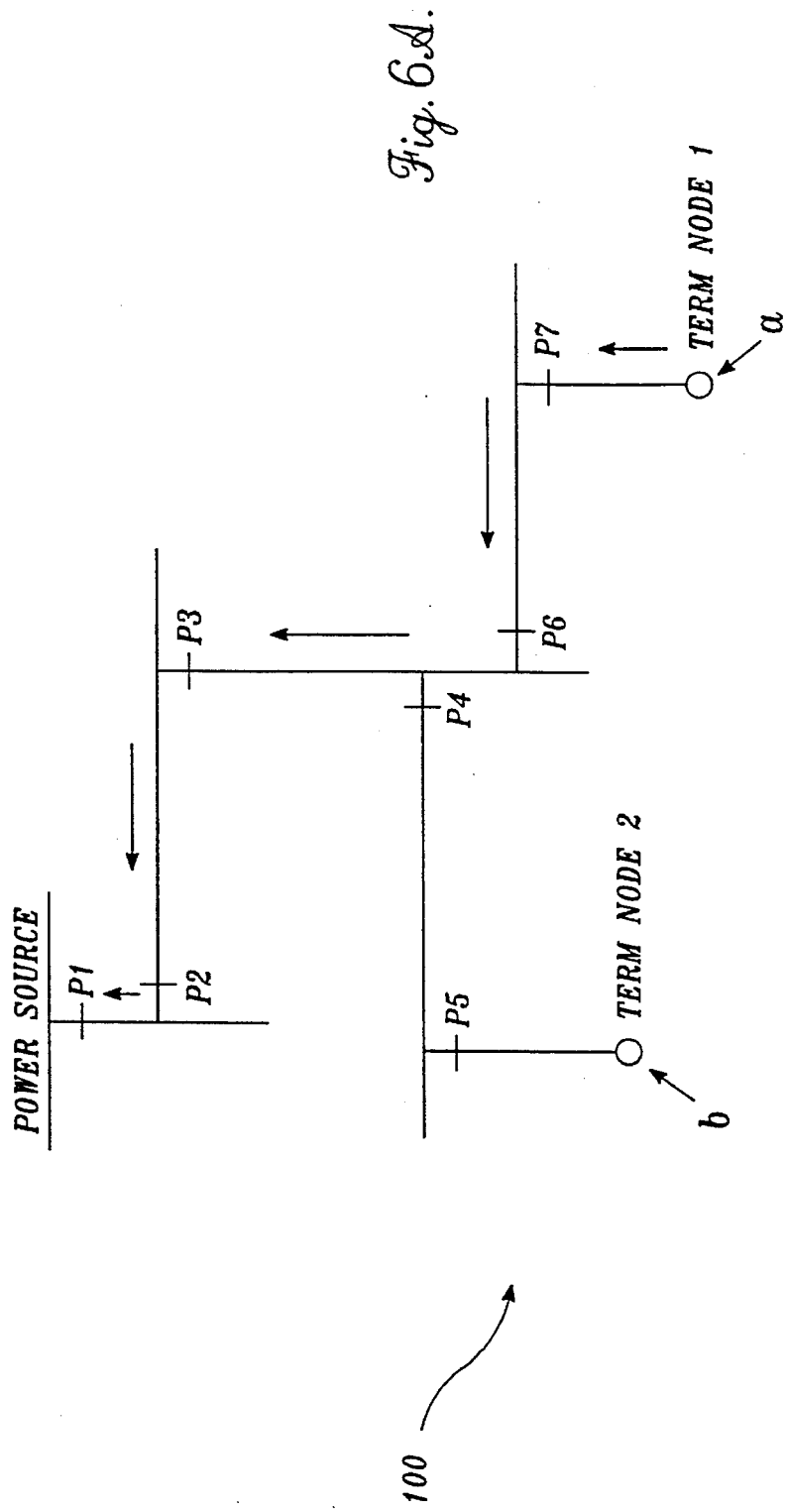

Fig. 8A. (120)

| k → ℓ ↓ | P1 | P2 | P3 | P4 | P5 | P6 | P7 | TERM NODE 1 | TERM NODE 2 |
|---|---|---|---|---|---|---|---|---|---|
| a | 1/21 | 2/21 | 3/21 | | | 4/21 | 5/21 | 6/21 | |
| b | 1/21 | 2/21 | 3/21 | 4/21 | 5/21 | | | | 6/21 |

Fig. 8B. (122)

| k | x | μNEW(x) |
|---|---|---|
| 1 | P1 | 2/21 |
| 2 | P2 | 4/21 |
| 3 | P3 | 6/21 |
| 4 | P4 | 4/21 |
| 5 | P5 | 5/21 |
| 6 | P6 | 4/21 |
| 7 | P7 | 5/21 |
| 8 | TERM NODE 1 | 6/21 |
| 9 | TERM NODE 2 | 6/21 |

| k → l ↓ | 1 | ... | 3 | ... | ... | ... | ... | ... | ... | ... | ... | TERM NODE τ | τ+1 USED |
|---|---|---|---|---|---|---|---|---|---|---|---|---|---|
| 1 | $\mu_{11}$ | $\mu_{12}$ | $\mu_{13}$ | | | | | | | | | P3 | P3 |
| ... | $\mu_{21}$ | | $\mu_{23}$ | | | $\mu_{1k}$ | | | | | | | P3 |
| ... | | | | | | | | | | | | | φ |
| ... | $\mu_{l1}$ | | $\mu_{l3}$ | | | | | | $\mu_{lk}$ | | | | P3 |
| ... | | | | | | | | | | | | | φ |
| q | $\mu q_1$ | | $\mu q_3$ | | | | | | | | | | P3 |

METHOD AND APPARATUS FOR POWER OUTAGE DETERMINATION USING DISTRIBUTION SYSTEM INFORMATION

FIELD OF THE INVENTION

This invention generally relates to power outage management systems, and particularly relates to a method and apparatus for power outage management using power distribution system information.

BACKGROUND OF THE INVENTION

Distribution systems utilized by electric power utilities generally consist of a power distribution grid having a control station, a power source, such as a substation, connected to a plurality of terminal nodes by grid branches, generally power wires, and corresponding protective devices, such as fuses or breakers, set up along the grid branches and designed to operate when a fault in the power distribution grid occurs, to ensure that only a minimal portion of the system is affected by the resulting power outage. During major storms, utilities track and prioritize power outages, dispatch and coordinate the labor force, and direct system restoration. In order to identify a power outage, determine the location of the fault that caused it, and estimate the number of affected customers, information from several different utility information systems must be combined and analyzed. In an effort to improve information feedback on their facilities and service reliability in general, utilities are developing and implementing geographic information systems (GIS) based automated mapping/facilities management (AM/FM) systems. Integration of GIS-based AM/FM systems with customer information systems (CIS) as well as supervisory control and data acquisition (SCADA) systems provides the optimal environment for an outage management system (OMS).

An OMS is, thus, a decision support environment that can be used to address complex problems faced by distribution dispatchers and system operators in an emergency situation. In an integrated environment obtained by combining information from GIS-based AM/FM systems, CIS, and SCADA systems, the OMS allows concurrent processing of data from multiple sources. Information from customer calls, received and logged in trouble order tracking (TOT) systems, or reports from other monitoring sources such as power outage monitors (so-called intelligent electronic devices) or automated meter reading systems that automatically contact the control station after loss of power is identified, distribution network topology, and protective device schema derived from GIS coverage maps, are combined to determine the probable fault location. In addition, the OMS can process power outages reported by SCADA alarms or field crew reports called in by radio.

Once a power outage is identified or reported, it is processed to determine the number of customers without power, checked for the existence of life-supporting devices, and sorted according to priorities that help dispatchers optimally dispatch crews. The OMS maintains current information on power outages, dynamically provides users with suggestions on the probable causes of power outages, and associates a level of confidence with its determination. The geographically referenced full graphic environment acts as an electronic "pin map" to display locations of trouble calls and determine the causes of power outages. At the same time, the geographically referenced full graphic environment allows the user to select, query, and update information associated with power outages and trouble calls.

When applied to customer calls reporting power outages, the OMS begins the process of power outage determination by analyzing all incoming calls and locating the caller's connection to the distribution network. First, the graphic display can mark the location of the trouble call with a special symbol. This creates an electronic "pin map" of the deenergized customers. Outage determination (OD) achieves a progressively higher confidence factor in establishing the protective device that is likely to have operated as a result of the fault causing the power outage as more calls come in. OD evaluates the protection schemes derived from GIS map coverages and compares them with the incoming calls. The OMS can be programmed such that, upon reaching a specified level (threshold) of confidence, the location of the fault causing the power outage is automatically determined. OMS can also be run in a semiautomatic mode, which can continuously update the OMS operator to the current confidence factor and allow the operator to make the final determination. Power outages reported from SCADA devices can be shown on the OMS display using different graphic symbols or colors from those used for the power outage reports that have come from the OD module, if desired. After the cause of the power outage is determined by the OMS power outage determination procedure, or reported by the SCADA alarms or a field crew by radio, the outage-processing procedure continues the analysis by identifying a list of customers affected, combining network connectivity maintained in GIS and customer data from the CIS.

The quality of an automated OMS depends highly on the inferencing power of the computerized OD procedure. To model the uncertainty involved with locating the probable location of a fault causing a power outage, appropriate tools and methods are needed. The conventional way to deal with uncertainty is to use tools and methods provided by the theory of probability. However, probability is an appropriate measure of uncertainty only in cases where statistical information is available. Therefore, current computerized OD procedures are unable to properly model the inexactness and uncertainty associated with locating faults due to the lack of distribution system information sufficient to form a statistical basis for inferring a confidence factor with any degree of success.

Accordingly, it is evident that there is a need for a method and apparatus for power outage determination using distribution system information that demonstrates superior inferencing power in modeling the uncertainty involved with determining the probable location of the fault causing a power outage. Such a method and apparatus should be able to more accurately model the uncertainty involved with determining the probable location of the fault using the same distribution system information available to current OMSs. The present invention is directed to fulfilling this need.

SUMMARY OF THE INVENTION

In accordance with the present invention, a method and apparatus are provided for determining the location of the protective device immediately upstream of the probable location of a fault causing a power outage in a power distribution system having a power distribution grid and a control station, the power distribution grid including a power source connected to a plurality of terminal nodes by grid branches and corresponding protective devices whose operation minimizes the deleterious effects of power outages. More specifically, a method and apparatus are provided for determining distribution system information based on the power distribution grid. Power outage information is then determined that describes the terminal node to which the power outage information is related, and a set of possibly operated protective devices is identified by upstream tracing from the terminal node, about which the power outage information was determined, to the power source. Using "fuzzy set" theory, the possibility that each protective device operated is calculated. The cumulative possibility that each protective device operated is then calculated as a function of the power outage information. This cumulative possibility is then compared to a predetermined confidence threshold associated with each protective device. If the cumulative possibility that a given protective device operated is greater than the confidence threshold, a conclusion is reached that the protective device operated.

In accordance with further aspects of this invention, determining distribution system information based on the power distribution grid includes determining distribution system topology and determining distribution protection schema. Distribution system topology includes an ordered list of the parent-child relationships that exist along the grid branches between the terminal nodes and the power source. Distribution protection schema include an ordered list of each protective device and its corresponding backup protective device.

In accordance with other aspects of this invention, determining the power outage information includes receiving calls to the control station from customers documenting loss of power in the power distribution grid.

In accordance with still other aspects of this invention, determining the power outage information includes receiving reports from monitoring sources that automatically alert the control station after loss of power is identified in the power distribution grid.

In accordance with yet other aspects of this invention, the possibility that each protective device operated is a function of the sequence order of the protective device.

In accordance with yet further aspects of this invention, calculating the cumulative possibility that each protective device operated is accomplished by summing the possibilities associated with the power outage information for each protective device.

In accordance with still other aspects of this invention, arriving at the outage determination conclusion that the protective device operated includes flagging the power outage information that is used in the conclusion. During subsequent program iterations, calculating the cumulative possibility that each protective device operated includes unflagging the power outage information when the outage determination conclusion is rejected, then calculating the cumulative possibility that each protective device operated as a function of the unflagged power outage information.

In accordance with yet still further aspects of this invention, calculating the cumulative possibility that each protective device operated is accomplished by summing the possibilities associated with the unflagged power outage information for each protective device.

As will be appreciated from the foregoing summary, the invention provides a method and apparatus for determining the protective device immediately upstream of the probable location of a fault causing a power outage using distribution system information that utilizes fuzzy set theory to model the uncertainty involved in analyzing power outages. By incorporating fuzzy set theory into the outage determination procedure, the invention is able to model uncertainty to a higher degree of accuracy based on information available, thereby gaining advantages over conventional OD procedures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 is a schematic block diagram of several components of a control system housed in the control station shown in FIG. 1 and used to carry out the present invention;

FIGS. 5A and 5B form a flowchart illustrating the steps carried out by an outage determination program formed in accordance with the present invention;

FIG. 6A is a digraph representing the power distribution grid with superimposed protective devices of FIG. 4A showing hypothetical terminal nodes 1 and 2, customers a and b, and an upstream tracing path from customer a at terminal node 1 to the power source;

FIG. 6B is a data structure representing the set of protective devices identified by the upstream tracing path of FIG. 6A;

FIG. 6C is a data structure representing the membership functions associated with each protective device of FIG. 6A (the possibility that each protective device operated);

FIG. 8A is a matrix showing the membership functions associated with each protective device along the paths from hypothetical customers a and b at terminal nodes 1 and 2, respectively;

FIG. 8B is a data structure representing the cumulative membership functions of each protective device described in the matrix of FIG. 8A (the cumulative possibility that each protective device operated); and FIG. 9 is a matrix showing all total possible membership functions for the power distribution grid of the type shown in FIG. 1 along with a column for a flag associated with each possible call indicating whether the call contributed to a particular outage determination conclusion.

DETAILED DESCRIPTION OF THE PREFERRED EMBODIMENT

Figure 1:
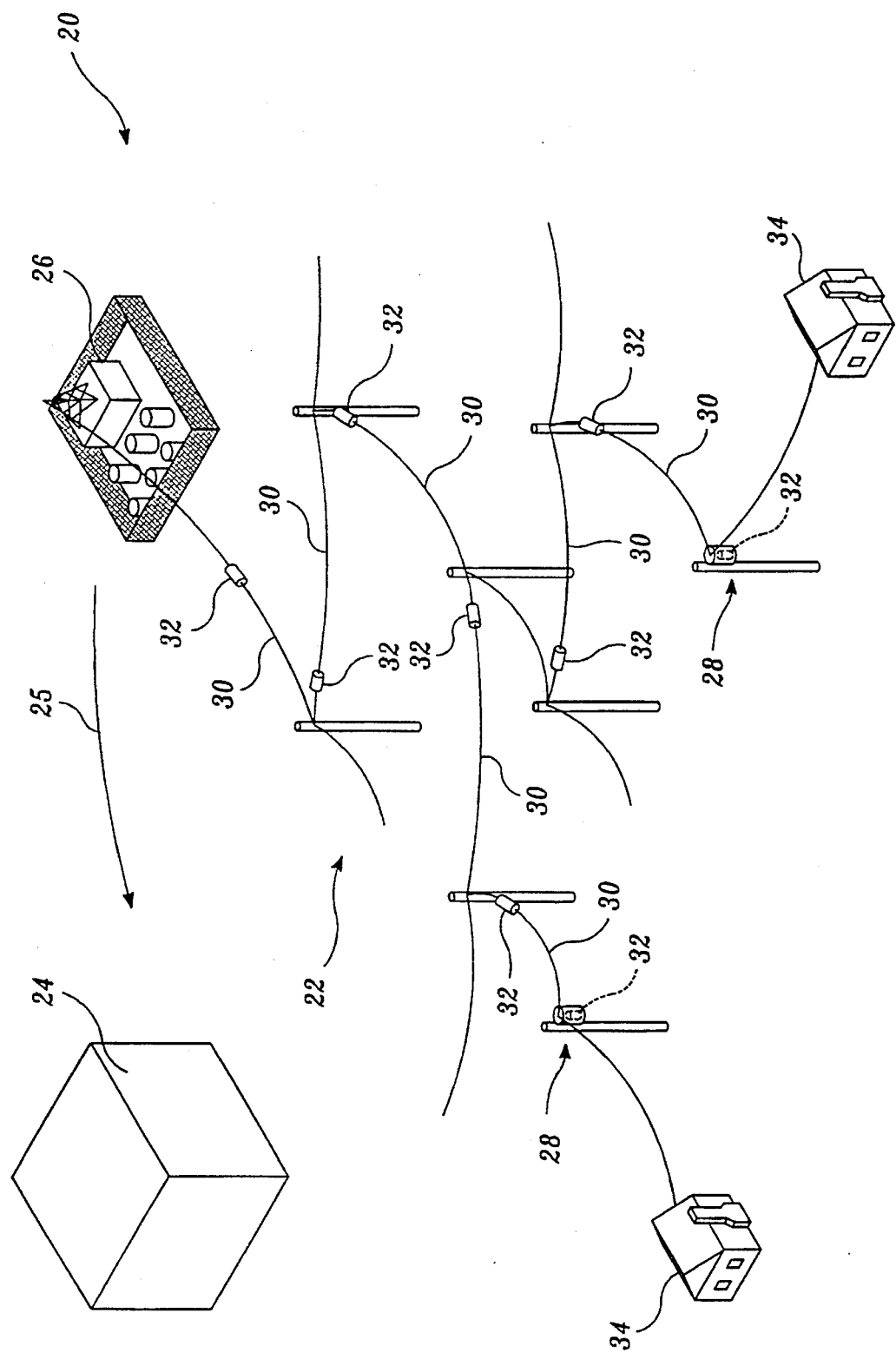
FIG. 1 is a graphical representation of a power distribution system in which the present invention is useful, showing the key system components, including a power distribution grid and a control station.

FIG. 1 shows a power distribution system 20 of the type in which the present invention is useful. For purposes of explaining the operation of the present invention, only the key components of the system are shown in FIG. 1. The system includes a simplified power distribution grid 22 and a control station 24. The power distribution grid 22 includes a power source 26 (a substation), a plurality of terminal nodes 28 (a distribution transformer or meter point), grid branches 30 used to establish a connection between the power source and the terminal nodes (power distribution lines), and protective devices 32 (consisting of fuses, fuse disconnects, reclosers, or other types of circuit breakers). The power source 26, which is served by a power transmission system (not shown), supplies power to the terminal nodes 28 via the grid branches 30, which in turn supply power to customers 34 connected to the respective terminal nodes. When a power outage occurs due to a fault, i.e., a break in the connection between the power source 26 and the terminal nodes 28, the protective device 32 closest upstream to the fault operates to limit the effect of the fault. The design of the system of protective devices seeks to ensure that only a minimal portion of the entire grid is affected during a power outage.

The function of the control station 24 is to oversee and maintain the operation of the associated power distribution grid 22 by obtaining a steady flow of information 25 concerning the status of the power distribution grid and responding to power outages produced by faults. In accomplishing this task, the control station relies on a control system 40. FIG. 2 shows a control system 40 constructed according to the teachings of the present invention. For purposes of explaining the operation of the present invention, the block diagram shows only the key components of the control system. The control system 40 includes a processing unit 42 coupled through an address/data bus 44 to a memory 46 and an I/O controller 48. The processing unit 42 is coupled via the I/O controller 48 to a keyboard 50, a permanent storage device 52, such as a hard disk drive, a CD ROM, or a floppy disk drive, a display 54, such as a monitor, and a modem 56.

The processing unit 42 of the control system 40 responds to programmed instructions stored in the permanent storage 52 and maintains values temporarily in the memory 46. Data relevant to the operation of the control system and operated upon by the programmed instructions may be directed to the processing unit by any known manner of input, including but not limited to manual entry through the keyboard 50 or telecommunication entry via the modem 56. Such data is then routed through the I/O controller 48 and along the address/data bus 44 to the processing unit 42. This and other dam utilized by the processing unit 42 as it responds to programmed instructions may be maintained temporarily in the memory 46, or more permanently in the storage 52. More specifically, the programmed instructions controlling the processing unit's operation in the preferred embodiment of the present invention determine the location of protective devices that possibly operated due to faults in the power distribution grid using distribution system information, such as distribution system topology and protective device schema. This information, in turn, is used to isolate the probable cause of the power outage.

Figures 3A, 3B:
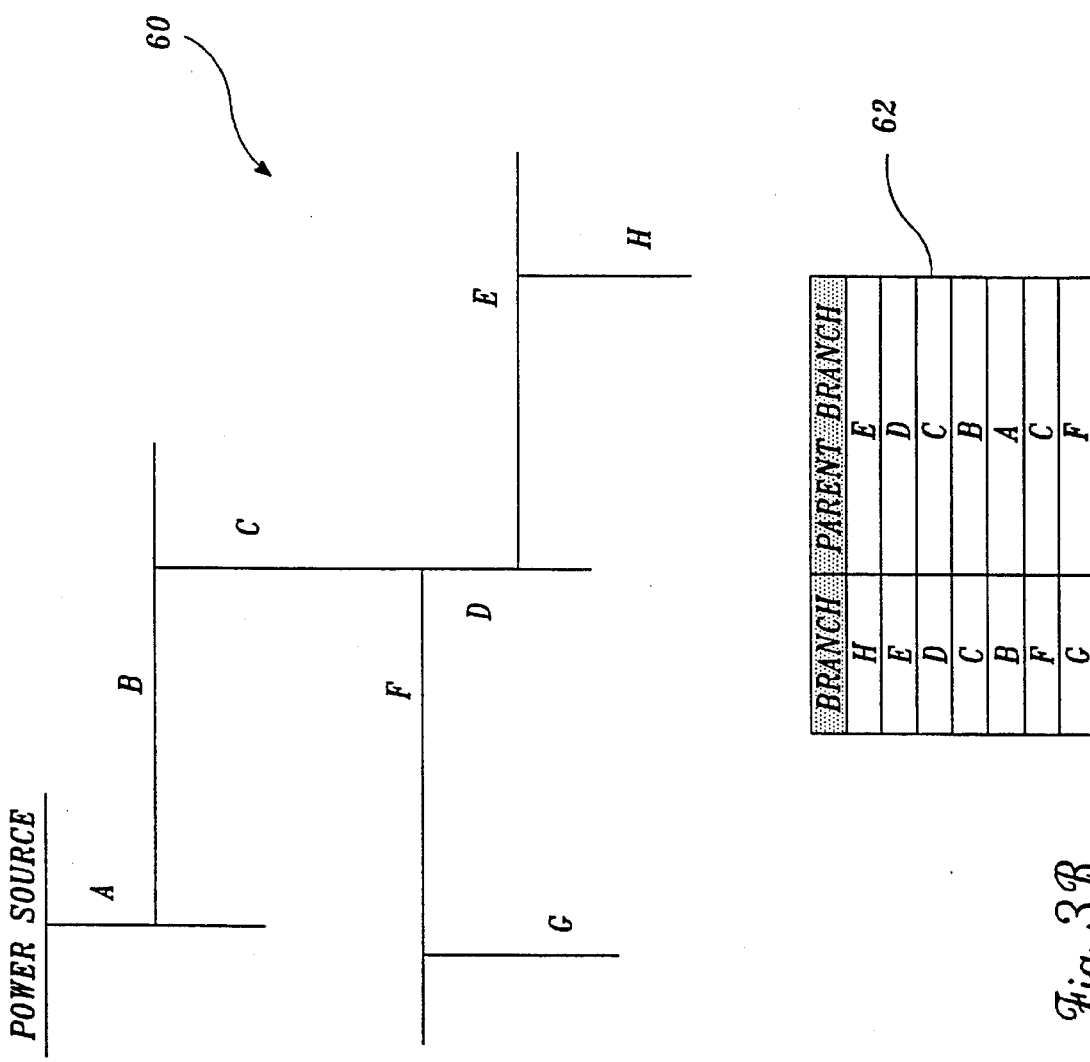
FIG. 3A is a digraph representing the functional topology of a power distribution grid.
FIG. 3B is a data structure representing the functional topology of FIG. 3A.

The distribution system topology used in the outage determination program of the present invention describes the functional topology or connectivity of the power distribution grid 22. In other words, the distribution system topology describes the electrical network that exists between the power source 26 and the terminal nodes 28. Referring to FIG. 3A, the functional topology of a power distribution grid is represented in a digraph 60. The functional topology shows the grid branches in the direction from the power source toward the terminal nodes. In order to more easily understand the distribution system topology to be used in the outage determination program of the present invention, each grid branch is uniquely identified by a corresponding letter A through H. FIG. 3B shows a data structure 62 representing the functional topology of digraph 60 utilized in the outage determination program, which constitutes a linked list where each grid branch contains a pointer to the "parent" grid branch, and which is stored in memory 46 and/or storage 52. For instance, the outage determination program of the present invention references the functional topology data structure 62 to determine that the parent of grid branch H is grid branch E, and that the parent of grid branch E is grid branch D, and so on. Proper reference to the distribution system functional topology by the outage determination program enables efficient upstream and downstream tracing along the power distribution grid. In other words, given a fault along a specified grid branch, the upstream parent of that "child" grid branch, or the grid branch between the child and the power source, is known by references to the intervening power system functional topology.

Figures 4A, 4B:
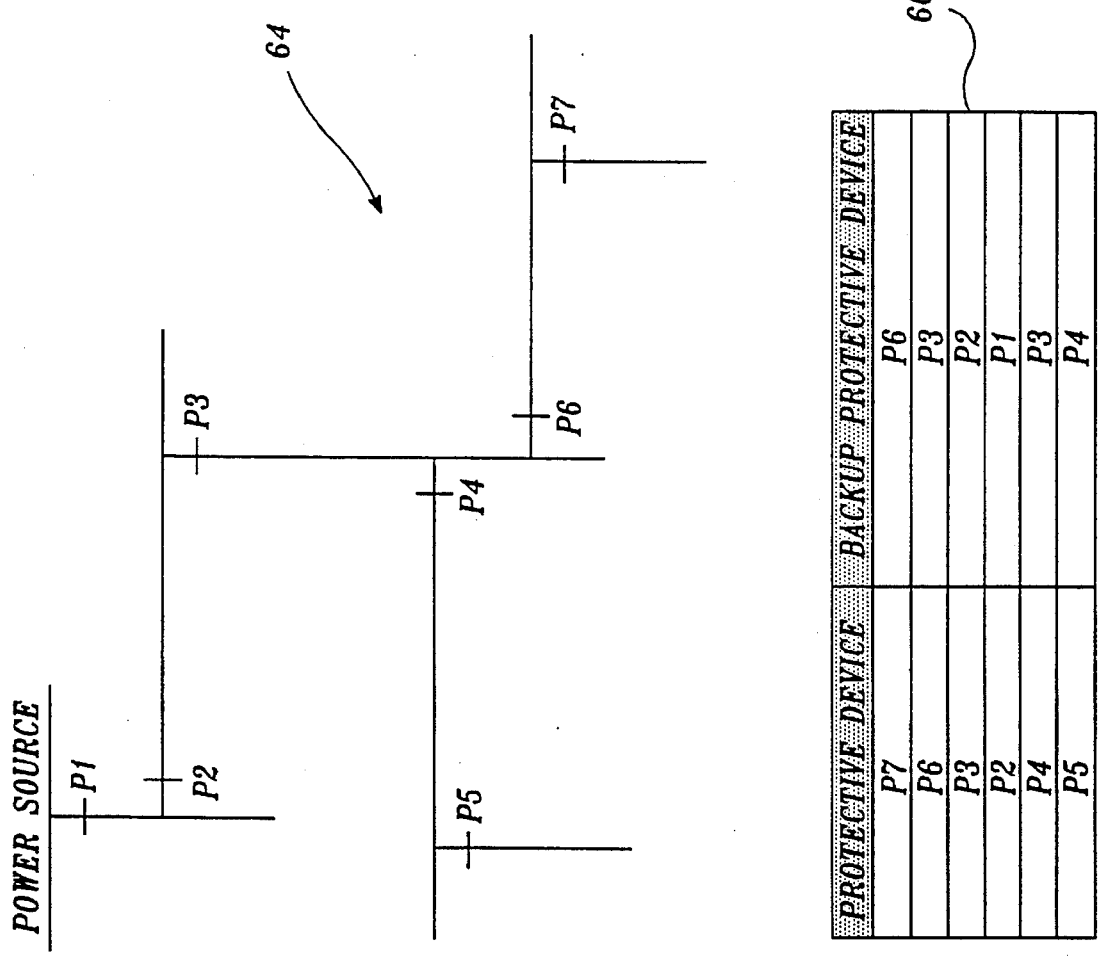
FIG. 4A is a digraph representing the power distribution grid shown in FIG. 3 A with superimposed protective devices.
FIG. 4B is a data structure representing the protective device schema of FIG. 4A.

In a similar fashion, the distribution system protection scheme utilized by the outage determination program of the present invention is based on the functional topology of the power distribution grid, or the relationship between the grid branches in the direction from the power source toward the terminal nodes. In this case, however, of significance are the protective devices associated with the particular grid branches between the power source and the terminal nodes. Referring to FIG. 4A, a power distribution grid with superimposed protective devices is represented in a digraph 64. Protective devices (P1, P2, P3, et cetera) are set up along the power distribution grid in a manner so as to ensure that only a minimal portion of the system is affected during a fault along a given grid branch. The resulting protective device schema relates to the order in which the protective devices would operate in case of a fault, and the associated backup protective device upstream from each operated protective device that may successively operate to minimize loss of overall power distribution grid integrity. Referring to FIG. 4B, a data structure 66 representing the protective device schema of digraph 64 utilized in the outage determination program is shown, which constitutes a linked list with each protective device pointing to its backup protective device, and which is stored in memory 46 and/or storage 52. In other words, by upstream tracing using data structure 66, it can be determined that the backup for protective device P7 is protective device P6, whose backup is in turn protective device P3, and so on. The protective device schema data structure 66 is dynamically maintained and updated following any changes to the distribution system functional topology during the operation of the power distribution system.

Figure 5B:
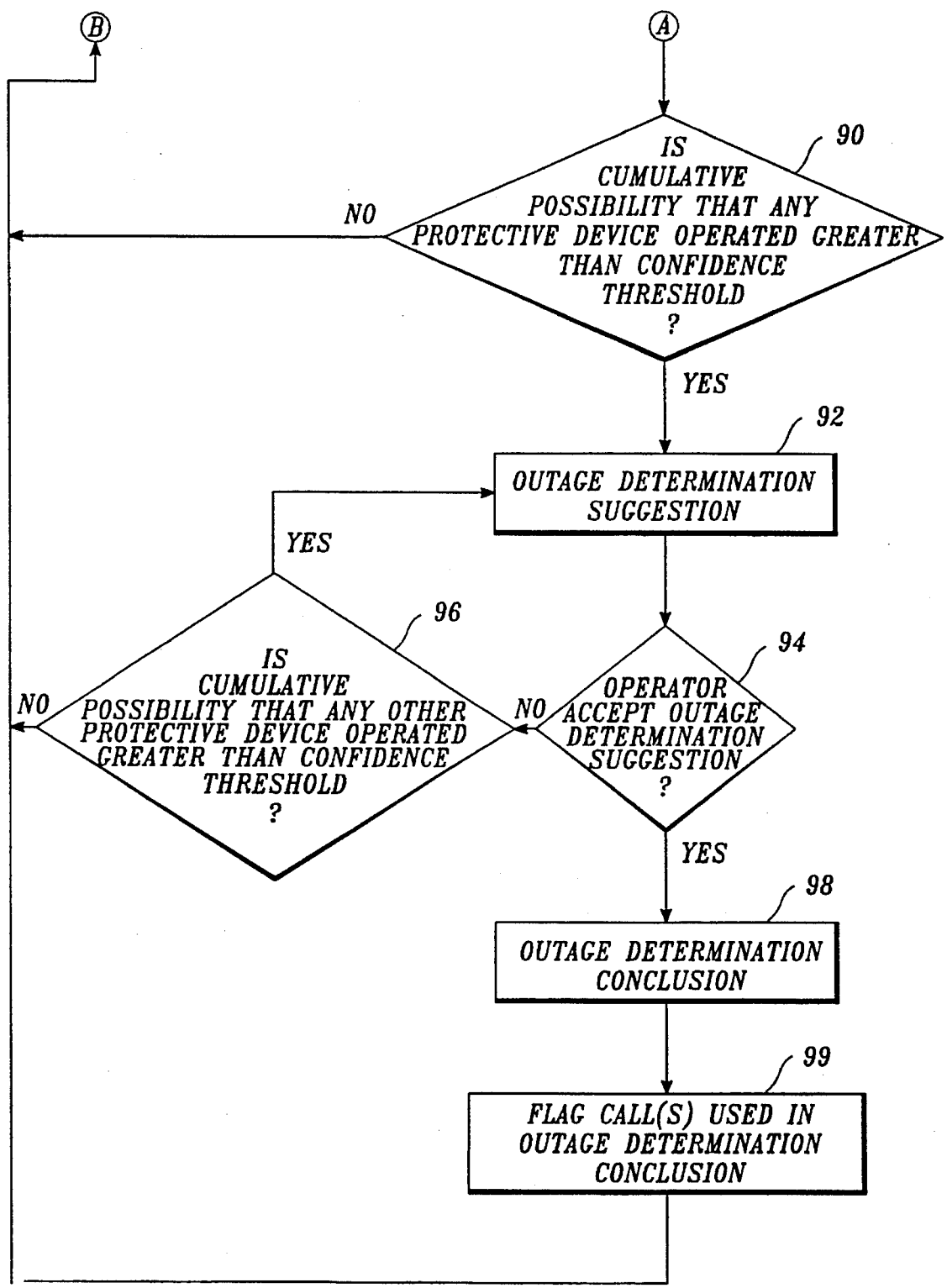

FIGS. 5A and 5B constitute a flowchart of an outage determination program 70 suitable for use by the processing unit 42 of the control system 40, which is stored in the storage device 52. Referring initially to FIG. 5A, as previously discussed, at blocks 72 and 74 data structures representing the distribution system topology and the distribution protection schema of the power distribution system in question are first generated. The program 70 then delays at block 76 until a call is received from a customer indicating that a power outage has occurred. It will be understood that, alternatively, a power outage could be reported from a variety of other monitoring sources. Examples of other monitor sources include power outage monitors (so-called intelligent electronic devices), located along the power distribution grid 22 or at the customers' locations, that automatically dial out a predefined number after loss of power is identified by an internal voltage relay, and automated meter-reading systems that sense power loss at the terminal nodes and signal the control station via wireless communication.

The logic of the program continues to decision block 78, where a test is made to determine if the customer call that was received reports an existing power outage or a new power outage, i.e., a power outage where no determination has been made as to which protective device operated. If the call reports an existing power outage, the logic of the program returns to the delay routine, block 76, and waits for a new customer call. If the call reports a new power outage, the logic of the program proceeds to block 80.

At block 80, a set of possibly operated protective devices 32 are determined by upstream tracing using the distribution system information generated at the block 74, starting at the terminal node defining the calling customer's location. More specifically, as the processing unit 42 continues to run the outage determination program 70, it accesses the protective device schema data structure 66 and identifies a set of possibly operated protective devices by following the linked list from the protective device closest to the terminal node defined by the customer's location to its backup protective device, then to the next upstream backup protective device, and so on until the protective device nearest the vower source is identified. In this manner, a complete set of protective devices that possibly operated due to the fault is determined. The set comprises all of the protective devices along the grid branch path between the customer and the power source.

The logic of the program 70 moves to block 82, where a membership function for each protective device in the set of possibly operated protective devices determined in the program block 80 is calculated. This calculation is made in reliance on fuzzy set theory. Fuzzy set theory is an approach useful for presenting and utilizing linguistic "qualitative" descriptions in computerized inferencing that improves the potential to model human reasoning in an inexact and uncertain domain in cases where statistical information is not available. The concept of possibility may be used to model the confidence level of various hypotheses by a number between 0 and 1, where 1 may be the highest degree of confidence and 0 the lowest or vice versa. In order to quantify inexactness, fuzzy set theory utilizes the notion of a membership function as the level of confidence that exists that an element belongs to the fuzzy set. At a program block 82, a membership function for each protective device in the set of possibly operated protective devices is calculated, the membership function representing the possibility that a particular protective device operated based on information obtained from a particular customer call.

The program logic proceeds to block 88, where the cumulative possibility that each protective device in the set operated is calculated. According to the logic of the program 70, the possibility that each protective device operated is affected by each customer call. If only a single customer call has been received, the cumulative possibility that a given protective device in the set operated will be no greater than the possibility that the given protective device operated based on that single customer call. If, however, more than one customer call has been received regarding the same power outage, the cumulative possibility that a given protective device operated will be greater for each successive customer call that identifies the particular protective device as one that possibly operated. Thus, in block 88, the calculated cumulative possibility that each protective device in the set operated is the sum of the possibilities associated with calls for each protective device. As further discussed below, this summing calculation includes only those calls and associated possibilities that are unflagged. In other words, only those calls not already used in a previous outage determination conclusion are used in determining the cumulative possibility that a protective device operated as a result of a different fault.

Referring now to FIG. 5B, in conjunction with FIG. 5A once the cumulative possibility that each protective device operated has been calculated, the logic of the program 70 proceeds to decision block 90, where a test is made to determine if the cumulative possibility that a given protective device operated is greater than the confidence threshold associated with that protective device. A confidence threshold is a predetermined value selected to indicate a minimum below which the program should not produce an outage determination conclusion for a given protective device in the power distribution grid. While the confidence threshold could be the same for all protective devices in a power distribution grid, different confidence thresholds can be associated with different protective devices. In the latter case, the confidence threshold levels are set by factors such as operator experience, type of protective device, type of power distribution grid, et cetera. If the cumulative possibility that the given protective device operated is not greater than the confidence threshold, the program logic returns to delay block 76 to await another customer call. If the cumulative possibility that the given protective device operated is greater than the confidence threshold, the logic of the program proceeds to block 92, where an outage determination suggestion is made. The suggestion identifies the particular protective device that the program has determined operated in response to the fault that caused the power outage.

The program logic proceeds to block 94 where the test is made to determine if the outage determination suggestion was accepted by the operator of the program. If the outage determination suggestion was not accepted by the operator, the logic proceeds to decision block 96, where a test is made to determine if the cumulative possibility that any other protective device in the set operated is greater than the associated confidence threshold. If the cumulative possibility that a different protective device operated is greater than its associated confidence threshold, the program logic returns to block 92, where an outage determination suggestion is made. In this case, the suggestion identifies the new protective device. The iterative loop involving blocks 92–96 continues until either an outage determination suggestion is accepted or the cumulative possibility that each protective device operated has been compared with its associated confidence threshold. If none of the cumulative possibilities of the remaining protective devices in the set are greater than their associated confidence thresholds, the logic returns to the delay block 76 to await a new customer call.

If the determination is made at block 94 that the outage determination suggestion with respect to a particular protective device should be accepted, the logic continues to block 98, where the conclusion is made that the protective device is the one that operated. At block 99, all customer calls used in making the outage determination conclusion at block 98 are flagged to remove them from consideration in subsequent iterations of the outage determination program. The logic of the program then returns to delay block 76, to await another customer call and a subsequent program iteration.

Concurrent with the above-described operation of the outage determination program 70, the processing unit 42 may also receive input as to the physical verification of previous outage determination conclusions. In particular, a previous outage determination conclusion may be rejected based on information obtained from field crew inspection of the power distribution grid revealing that the fault was not near the protective device indicated. Referring now to FIG. 5A, when an outage determination conclusion is rejected in block 84, the program logic proceeds to block 86, where all calls that led to the erroneous conclusion, and that were previously flagged, are unflagged. The logic of blocks 84 and 86 then intercepts the program logic prior to its cumulative possibility calculation in block 88. To ensure that the cumulative possibility data are current, the remaining program steps, namely, those in blocks 88 through 99, are performed.

To better understand the logic and effect of the outage determination program 70, in terms of the iteration it performs to determine whether a conclusion as to the operation of a given protective device is warranted, and to present more specifically the actual calculations performed in the program's operation, a more detailed description of the operation of the program for a hypothetical power outage is set forth below and illustrated in FIGS. 7 through 9.

Determination of the Set of Possibly Operated Protective Devices

As noted above, after a new power outage call is received from a customer, identified as customer a, in program block 76 shown in FIG. 5A, the processing unit 42 of the control station 22 proceeds to block 80 to determine the set of protective devices 32 whose operation could have resulted from a fault that caused the reported power outage. As illustrated by reference to FIG. 6A, this is accomplished by upstream tracing along the protective device schema represented in a digraph 100 by use of the protective device schema data structure 66 discussed above. Starting from the terminal node 1 to which customer a is connected, the processing unit identifies each protective device and its backup protective device between customer a and the power source 26 (the identification process is illustrated on the protective device schema of digraph 100 by path arrows). FIG. 6B is a data structure 102 representing the set of protective devices identified by the upstream tracing path represented in digraph 100 that is stored in the memory 46 and/or the storage 52.

Calculation of the Possibility that Each Protective Device Operated

After determining the set of possibly operated protective devices, the processing unit 42 proceeds to block 82 of the outage determination program 70 where the possibility that each protective device in the set operated is calculated. To understand the calculation accomplished by the processing unit at this stage of the operation of the outage determination program 70, let $\alpha$ represent a crisp set of n protective devices $x_i$ encountered in the upstream tracing depicted in the protective device schema of digraph 100 and given in the protective device set data structure 102. That is:

$$\alpha = \{x_i\} \tag{1}$$

where i denotes the sequence order of the protective device starting from the power source (i=1) and ending at terminal node 1 that customer a is connected to (i=n).

The fuzzy set A that contains the protective devices that possibly operated and left customer a without power can be represented as a set of ordered pairs of possibly operated protective devices $x_i$, and the grade of membership function $\mu_A(x_i)$ is:

$$A = \{(x_i, \mu_A(x_i)) | x_i \in \alpha\} \tag{2}$$

where the membership function of the fuzzy set A (the possibility that the protective device $x_i$ operated associated with customer a's call) is defined by the equation:

$$\mu_A(x_i) = \frac{i}{\sum_{i=1}^{n} i} \tag{3}$$

Equation (3) takes into account the selectivity of the protective device schema in modeling the membership function of the protective device that operated in regard to the call of customer a. The closer the protective device is to the caller (larger value of i), the higher is the possibility that the protective device operated. Furthermore, equation (3) gives a normalized membership function where:

$$\sum_{i=1}^{n} \mu_A(x_i) = 1 \tag{3A}$$

which means that every call, regardless of the number of protective devices whose operation could have been the cause of the power outage, carries an equal mount of information needed for the outage determination program 70.

As noted above, after the call from customer a has been received and the set of protective devices in the upstream trace identified, the values are stored in the protective device set data structure 102. The processing unit 42 then determines a fuzzy set A by calculating the value of the membership function for all protective devices using equation (3). FIG. 6C is a data structure 104 representing the values of this fuzzy set, including the membership functions associated with each protective device, that are stored in the memory 46 and/or the storage 52.

Referring to FIGS. 5A and 5B, assuming that the call from customer a represents the first call to the control system relating to a particular power outage, and that therefore this was the first iteration of the program, the program flow would proceed directly to block 88 without any input from blocks 84 and 86, since no prior outage determination conclusion had been made that could have been rejected. Given only a single call, the calculation in block 88 would result in a cumulative possibility that each protective device operated equal to the membership function of each protective device, and the same set of values as shown in fuzzy set data structure 104 of FIG. 6C. Assuming, as likely, that the confidence threshold associated with each protective device requires more than one call as the basis for an outage determination suggestion, the confidence level determination of block 90 would be made negatively, and the program logic would return to delay block 76 to await another customer call.

Figures 7A, 7B, 7C:
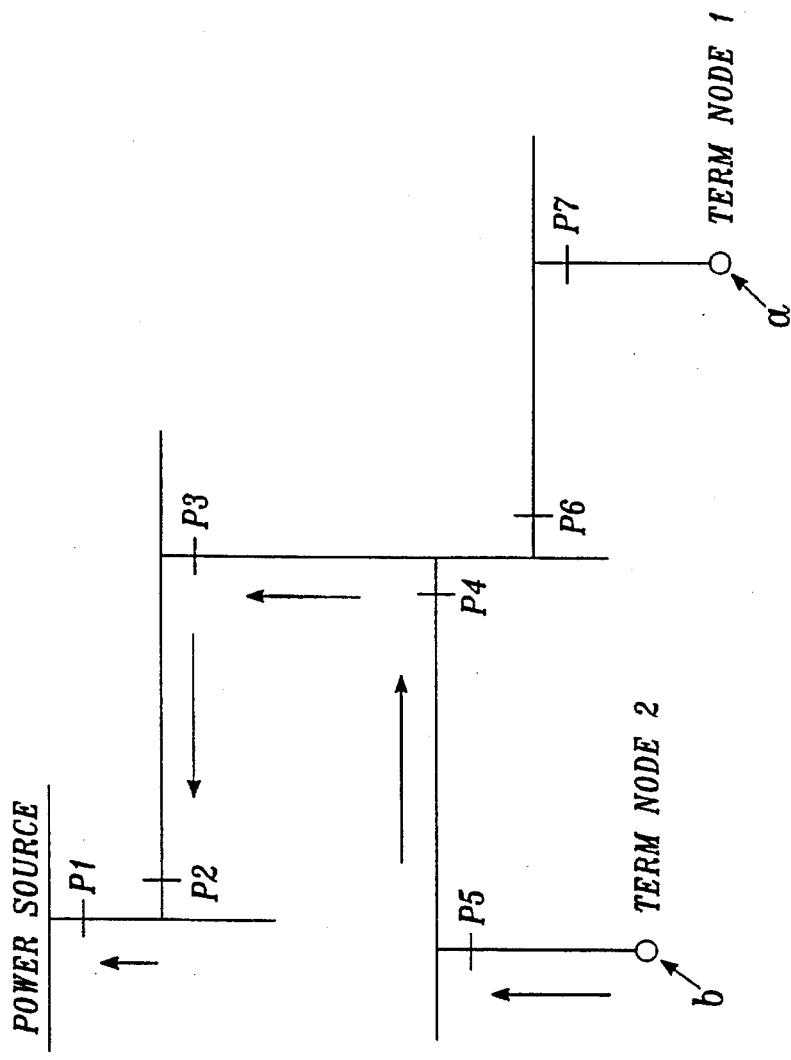
FIG. 7A is a digraph representing the power distribution grid with superimposed protective devices of FIG. 4A showing hypothetical terminal nodes 1 and 2, customers a and b, and an upstream tracing path from customer b at terminal node 2 to the power source.
FIG. 7B is a data structure representing the set of protective devices identified by the upstream tracing path of FIG. 7A.
FIG. 7C is a data structure representing the membership functions associated with each protective device of FIG. 7A.

Assuming customer b calls next to report a power outage, the processing unit 42 of the control station 22 again proceeds to block 80 and another set of protective devices 32 whose operation could have caused this reported outage is determined. As illustrated by reference to FIG. 7A, this is accomplished by upstream tracing along a protective device schema represented in a digraph 110 by use of the protective device schema data structure 66 discussed above. Starting from the terminal node 2 to which customer b is connected, the processing unit identifies each protective device and its backup protective device between customer b and the power source 26 (illustrated on the protective device schema of digraph 110 by path arrows). FIG. 7B is a data structure 112 representing the set of protective devices identified by the upstream tracing path represented in digraph 110 that is stored in the memory 46 and/or the storage 52.

After determining the set of possibly operated protective devices for the call from customer b, the processing unit 42 proceeds to block 82 where the possibility that each protective device in the set operated is calculated by first determining the crisp set $\beta$ of m protective devices $x_j$ encountered in the upstream trace depicted in the protective device schema of digraph 110 and given in the protective device set data structure 112. That is:

$$\beta = \{x_j\} \tag{4}$$

where j denotes the sequence order of the protective device starting from the protective device nearest the power source (j=1) and ending at the terminal node 2 to which customer b is connected (j=m).

In this case, fuzzy set B, representing the protective device that operated as a result of a fault and left customer b without power, is modeled as a set of ordered pairs of possibly operated protective devices $x_j$, and the grade of the membership function $\mu_B(x_j)$ is:

$$B = \{(x_j, \mu_B(x_j)) | x_j \in \beta\} \tag{5}$$

where the membership function of the fuzzy set B (the possibility that the protective device $x_j$ operated associated with customer b's call) is given by the equation (3) using new protective devices $x_j$ and their total number m. The equation is:

$$\mu_B(x_j) = \frac{j}{\sum_{j=1}^{m} j} \tag{6}$$

As noted above, after the call from customer b has been received and the set of protective devices in the upstream trace identified, the values are stored in the protective device data structure 112. The processing unit 42 then determines a fuzzy set B by calculating the value of the membership function for all devices using equation (6). FIG. 7C is a data structure 114 representing the values of this fuzzy set, including the membership functions associated with each protective device, that are stored in the memory 46 and/or the storage 52.

Fuzzy sets A and B can contain the same protective devices since the same fault could have caused a power outage for both customers. These protective devices are members of the crisp set $\Gamma = \{x\}$ where $\Gamma = \alpha \cap \beta$. The possibility that caller a and caller b are without power because the same protective device $x \in \Gamma$ operated can be viewed as a membership function $\mu_{A \cup B}(x)$ of a fuzzy set C defined by the equation:

$$C = \{(x, \mu_{A \cup B}(x)) | x \in \Gamma\} \tag{7}$$

where $\mu_{A \cup B}(x)$ is given as the Hamacher union for $\gamma=0$:

$$\mu_{A \cup B}(x) = \mu_A(x) + \mu_B(x) \tag{8}$$

or:

$$\mu_{A \cup B}(x) = \frac{i}{\sum_{i=1}^{n} i} + \frac{j}{\sum_{j=1}^{m} j} \tag{9}$$

where i and j are the sequence order of the particular protective device x in set $\alpha$ and $\beta$ respectively, and n and m are the number of protective devices in these sets, The depth of the protective device in the power distribution grid, or distance the protective device is from the power source, plays an important part in the outage determination analysis. The deeper the common protective device x is in the protective device schema (larger values of i and j), the higher the possibility that it was the protective device operated in response to the fault that caused the reported power outage. However, the deeper the protective device is in the protective device schema, the lower the probability that the protective device will be shared by two or more customers.

Determination of the Cumulative Possibility that a Protective Device Operated

As seen in equation (9), every new customer call will cumulatively increase the possibility that a particular protective device x operated as a result of a fault if protective device x is found on the trace path from the terminal node nearest the customer caller location to the power source. For each protective device x that is a member of the crisp set $\Gamma_{NEW}$ of possibly operated protective devices in regard to the new customer call, equation (9) can be rewritten in sequential form as:

$$\mu_{NEW}(x) = \mu_{OLD}(x) + \frac{j}{\sum_{j=1}^{m} j} \tag{10}$$

where j is the sequence order of the particular protective device x in set $\Gamma_{NEW}$ and m is the number of protective devices in $\Gamma_{NEW}$ (cardinality of the set $\Gamma_{NEW}$). In a case where the protective device x is not found in the trace path of any previous calls, $\mu_{OLD}(x)$ is equal to 0. As will be best understood by reference to FIGS. 5A and 5B, during the initial iteration of the outage determination program 70, the logic of the program proceeds to execute the instructions in the block 88, where the program undertakes the calculation of the cumulative possibility that each protective device in the set operated. Using equation (10) described above, the processing unit 42 makes this calculation by summing the membership functions of the eligible protective devices in the set or, in other words, by summing the possibilities associated with calls for each protective device.

For each protective device, a confidence threshold must be established $\mu_{MAC}(x)$, such that, when the cumulative possibility that protective device x operated exceeds this threshold:

$$\mu_{NEW}(x) > \mu_{MAX}(x) \tag{11}$$

the outage determination program 70 draws the conclusion that protective device x operated. The confidence threshold $\mu_{MAX}(x)$ must be appropriately set according to the needs and tendencies of the power distribution system as a whole. Setting the confidence threshold too low globally can force the outage determination program to jump to a conclusion prematurely, while setting it too high can delay a conclusion and give the appearance that the outage determination program is slow and indecisive. This confidence threshold is used in the decision block 90, where the determination is made whether the cumulative possibility that any protective device in the set operated is greater than the confidence threshold.

As new calls come in, the cumulative possibility that each protective operated as a result of the fault will increase based on how often each protective device is found in the traced paths of the calls, Due to the hierarchical structure of the protective device tree, protective devices that are closer to the power source (or farther away from the terminal nodes) will be found more often in the traced paths than protective devices that are closer to the terminal nodes. To avoid deterioration of the protection selectivity modeled in equations (3) and (6) for determining the membership functions of the protective devices, the confidence threshold of the protective devices can be weighted by the total number of possible callers in the power distribution grid N(x). This number can be determined by downstream tracing from the protective device x to each and every terminal node and by counting the number of customers fed from these nodes, based on information available in the customer information system (CIS) database.

Outage Determination Procedure

As customer calls are coming in, for each new call the possibility that one of the protective devices found in the upstream trace operated can be determined using equation (3). All calls received up to a certain point in time, with appropriate membership functions for the fuzzy set protective device that operated in regard to this call, can be arranged in matrix form M defined by the equation:

$$M = \{\mu(l,k)\} \quad (l=1,\ldots q; \ k=1,\ldots r) \quad (12)$$

where q is the number of rows that M contains and equals the number of customer calls received up to that moment, while r is the total number of protective devices whose operation can leave customers without power. After each new customer call, the number of matrix M rows increases by one. Elements of the matrix M are possibilities that the k-th protective device operated in the case of l-th customer call, calculated using equation (3). In the present example, after the calls from customers a and b are received, the matrix M has a form 120 shown in FIG. 8A.

The cumulative possibility that a given protective device operated based on customer calls received to that point is calculated using equation (10). Applying matrix M notation, $\mu_{NEW}(k)$ can be calculated according to equation (13):

$$\mu_{NEW}(k) = \sum_{l=1}^{l=q} \mu(l,k) \quad (k=1,\ldots r) \quad (13)$$

The cumulative membership functions for the protective devices $x_k$ after the customer calls a and b have been received (or cumulative possibility that protective devices $x_k$ operated) are calculated and the resulting values stored in the memory 46 and/or the storage 52 in a cumulative possibility data structure 122, as illustrated in FIG. 8B.

If, after q customer calls, the cumulative possibility for one protective device (for example P3) exceeds the predetermined confidence threshold $\mu_{MAX}(P3)$, the outage determination program will suggest that P3 is the protective device that operated, as indicated in program block 92 shown in FIG. 5B. Assuming that the system operator accepts the outage determination suggestion in block 94, the program proceeds to block 98 where an outage determination conclusion as to the operation of the particular protective device is made.

All the customer calls that contributed to the cumulative membership function $\mu_{NEW}(P3)$ (calls that have the protective device P3 in its trace path) are flagged to indicate that they led to this conclusion. Since only a single protective device can be pinpointed, contributions from these calls to the cumulative membership function of any other protective device in the set are removed. In addition, since the information these calls contain is already being used to draw a conclusion, the information about these calls is also eliminated from further evaluation. This is accomplished at program block 99, shown in FIG. 5B, by way of a new column (r+1) added to the matrix M. When a call is used in a particular outage determination conclusion, the call is flagged using this new column. Referring to FIG. 9, after q customer calls are received and an outage determination conclusion is drawn that protective device P3 operated, a new matrix 124 is formed. In the matrix 124, the r+1 column has flagged the customer calls that contributed to any previous outage determination conclusion, in our example all customer calls used in the conclusion that the protective device P3 operated.

After an outage determination conclusion is drawn about the protective device that operated, the cumulative possibility for other protective devices can be recalculated using a modified equation (13) that takes into account only those customer calls that have not been used to draw any prior outage determination conclusion:

$$\mu_{NEW}(k) = \sum_{\substack{l=1 \\ \text{where}-(M(l,r+1)=0)}}^{l=q} \mu(l,k) \quad (k=1,\ldots r) \quad (14)$$

If the outage determination suggestion proves to be wrong after a field crew inspection, the conclusion is rejected, and all calls that led to this conclusion are unflagged and put back for further evaluation. This is accomplished in blocks 84 and 86, respectively. As described above, concurrent with the operation of the outage determination program 70 as initiated by new customer calls reporting power outages, a prior outage determination conclusion may be rejected based on physical inspection of the power distribution grid. When this occurs, all calls that led to the erroneous conclusion, and that were previously flagged, are unflagged. The logic of blocks 84 and 86 then intercepts the program logic prior to its cumulative possibility calculation in block 88. To ensure that the cumulative possibility data is current, the remaining program steps, namely, those in blocks 88 through 99, are performed.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for determining the location of the protective device immediately upstream of the probable location of a fault causing a power outage in a power distribution system having a power distribution grid with a power source connected to a plurality of terminal nodes by grid branches and corresponding protective devices whose operation minimizes the deleterious effects of power outages, and a control station, comprising:

(a) determining distribution system information based on the power distribution grid;

(b) determining power outage information describing the terminal node to which the power outage information is related;

(c) identifying a set of possibly operated protective devices by upstream tracing from the terminal node, about which the power outage information was determined, to the power source;

(d) calculating a possibility that each protective device operated;

(e) calculating a cumulative possibility that each protective device operated as a function of the power outage information;

(f) comparing the cumulative possibility that each protective device operated to a predetermined confidence threshold; and (g) if the cumulative possibility that a given protective device operated is greater than the confidence threshold, concluding that the protective device operated.

2. The method of claim 1, wherein the step of determining distribution system information based on the power distribution grid includes:

(a) determining distribution system topology; and (b) determining distribution protection schema.

3. The method of claim 2, wherein the distribution system topology includes an ordered list of the parent-child relationships that exist along the grid branches between the terminal nodes and the power source.

4. The method of claim 2, wherein the distribution protection schema include an ordered list of each protective device and its corresponding backup protective device.

5. The method of claim 1, wherein the step of determining the power outage information includes receiving calls to the control station from customers documenting loss of power in the power distribution grid.

6. The method of claim 1, wherein the step of determining the power outage information includes receiving reports from monitoring sources that automatically alert the control station after loss of power is identified in the power distribution grid.

7. The method of claim 1, wherein the possibility that each protective device operated is a function of the sequence order of the protective device.

8. The method of claim 1, wherein the step of calculating the cumulative possibility that each protective device operated is accomplished by summing the possibilities associated with the power outage information for each protective device.

9. The method of claim 1, wherein:

(a) the step of concluding that the protective device operated includes flagging the power outage information that is used in the conclusion; and (b) the step of calculating the cumulative possibility that each protective device operated includes:

(i) unflagging the power outage information when the outage determination conclusion is rejected; and (ii) calculating the cumulative possibility that each protective device operated as a function of the unflagged power outage information.

10. The method of claim 9, wherein the step of calculating the cumulative possibility that each protective device operated is accomplished by summing the possibilities associated with the unflagged power outage information for each protective device.

11. Apparatus for determining the location of the protective device immediately upstream of the probable location of a fault causing a power outage in a power distribution system having a power distribution grid with a power source connected to a plurality of terminal nodes by grid branches and corresponding protective devices whose operation minimizes the deleterious effects of power outages, and a control station, comprising:

(a) a memory for storing program instructions;

(b) means for inputting information relating to the power distribution grid; and (c) a processing unit, coupled to said memory and said input means, for determining the location of a fault by:

(i) determining distribution system information based on the power distribution grid;

(ii) determining power outage information describing the terminal node to which the power outage information is related;

(iii) identifying a set of possibly operated protective devices by upstream tracing from the terminal node about which the power outage information was determined to the power source;

(iv) calculating a possibility that each protective device operated;

(v) calculating a cumulative possibility that each protective device operated as a function of the power outage information;

(vi) comparing the cumulative possibility that each protective device operated to a predetermined confidence threshold; and (vii) if the cumulative possibility that a given protective device operated is greater than the confidence threshold, concluding that the protective device operated.

12. The apparatus of claim 11, wherein said processing unit determines distribution system information based on the power distribution grid by:

(a) determining distribution system topology; and (b) determining distribution protection schema.

13. The apparatus of claim 12, wherein the distribution system topology includes an ordered list of the parent-child relationships that exist along the grid branches between the terminal nodes and the power source.

14. The apparatus of claim 12, wherein the distribution protection schema includes an ordered list of each protective device and its corresponding backup protective device.

15. The apparatus of claim 11, wherein said processing unit determines the power outage information by receiving calls to the control station from customers documenting loss of power in the power distribution grid.

16. The apparatus of claim 11, wherein said processing unit determines the power outage information by receiving reports from monitoring sources that automatically alert the control station after loss of power is identified in the power distribution grid.

17. The apparatus of claim 11, wherein the possibility that each protective device operated is a function of the sequence order of the protective device.

18. The apparatus of claim 11, wherein said processing unit calculates the cumulative possibility that each protective device operated by summing the possibilities associated with the power outage information for each protective device.

19. The apparatus of claim 11, wherein:

(a) as part of concluding that the protective device operated, said processing unit flags the power outage information that is used in the conclusion; and (b) said processing unit calculates the cumulative possibility that each protective device operated by:

(i) unflagging the power outage information when the outage determination conclusion is rejected; and (ii) calculating the cumulative possibility that each protective device operated as a function of the unflagged power outage information.

20. The apparatus of claim 19, wherein said processing unit calculates the cumulative possibility that each protective device operated by summing the possibilities associated with the unflagged power outage information for each protective device.

* * * * *